(12) United States Patent
Shin et al.

(10) Patent No.: US 11,488,804 B2
(45) Date of Patent: Nov. 1, 2022

(54) SHOWER HEAD ASSEMBLY AND PLASMA PROCESSING APPARATUS HAVING THE SAME

(71) Applicant: SAMSUNG ELECTRONICS CO., LTD., Suwon-si (KR)

(72) Inventors: Youngwon Shin, Suwon-si (KR); Heechul Lee, Suwon-si (KR); Joonsung Lee, Suwon-si (KR); Hyunjae Jung, Suwon-si (KR); Hyungchul Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 476 days.

(21) Appl. No.: 16/665,120

(22) Filed: Oct. 28, 2019

(65) Prior Publication Data

US 2020/0365373 A1 Nov. 19, 2020

(30) Foreign Application Priority Data

May 14, 2019 (KR) ........................ 10-2019-0056039

(51) Int. Cl.
*H01J 37/32* (2006.01)
*H01L 21/3213* (2006.01)

(52) U.S. Cl.
CPC .. *H01J 37/32449* (2013.01); *H01J 37/32568* (2013.01); *H01L 21/32136* (2013.01); *H01J 2237/3341* (2013.01)

(58) Field of Classification Search
CPC ........... H01J 37/32449; H01J 37/32568; H01J 21/32136; H01J 2237/3341; H01J 9/242
See application file for complete search history.

(56) References Cited

U.S. PATENT DOCUMENTS

| 6,391,787 B1 | 5/2002 | Dhindsa et al. |
| 8,435,379 B2 | 5/2013 | Mehta et al. |
| 8,636,872 B2 | 1/2014 | Matsuyama |
| 2011/0028001 A1* | 2/2011 | Je ...................... C23C 16/45565 438/758 |
| 2011/0126853 A1* | 6/2011 | Moriya ............... H01J 37/3244 134/1.1 |

(Continued)

FOREIGN PATENT DOCUMENTS

| KR | 10-2001-0028264 A | 4/2001 |
| KR | 10-2011-0031466 A | 3/2011 |

(Continued)

*Primary Examiner* — Wei (Victor) Y Chan
(74) *Attorney, Agent, or Firm* — Lee IP Law, P.C.

(57) ABSTRACT

A shower head assembly for a plasma processing apparatus in which a substrate is accommodatable on a substrate stage within a chamber, a plasma processing apparatus, and a plasma processing method, the shower head assembly including a shower plate including a plurality of injection holes through which a gas is sprayable out toward the substrate; and a compensation plate on a lower surface of the shower plate and facing the substrate, the compensation plate including a first compensating portion having first gas passages of a first length and a second compensating portion having second gas passages of a second length that is greater than the first length, wherein the first gas passage and the second gas passage are respectively in fluid communication with the injection holes.

19 Claims, 9 Drawing Sheets

(56) References Cited

U.S. PATENT DOCUMENTS

2011/0318934 A1* 12/2011 Wada ................ H01J 37/3255
438/714
2016/0177448 A1 6/2016 Ikeda
2021/0398786 A1* 12/2021 Ikeda ................ H01J 37/32935

FOREIGN PATENT DOCUMENTS

KR 10-1664840 B1 10/2016
KR 10-1765573 B1 8/2017

* cited by examiner

SHOWER HEAD ASSEMBLY AND PLASMA PROCESSING APPARATUS HAVING THE SAME

CROSS-REFERENCE TO RELATED APPLICATION

Korean Patent Application No. 10-2019-0056039, filed on May 14, 2019, in the Korean Intellectual Property Office, and entitled: "Shower Head Assembly and Plasma Processing Apparatus Having the Same," is incorporated by reference herein in its entirety.

BACKGROUND

1. Field

Embodiments relate to a shower head assembly and a plasma processing apparatus having the same.

2. Description of the Related Art

Many types of semiconductor devices may be manufactured using plasma-based etching techniques. For example, a plasma etching apparatus such as a capacitively coupled plasma etching apparatus may generate plasma within a chamber to perform an etching process.

SUMMARY

The embodiments may be realized by providing a shower head assembly for a plasma processing apparatus in which a substrate is accommodatable on a substrate stage within a chamber, the shower head assembly including a shower plate including a plurality of injection holes through which a gas is sprayable out toward the substrate; and a compensation plate on a lower surface of the shower plate and facing the substrate, the compensation plate including a first compensating portion having first gas passages of a first length and a second compensating portion having second gas passages of a second length that is greater than the first length, wherein the first gas passage and the second gas passage are respectively in fluid communication with the injection holes.

The embodiments may be realized by providing a plasma processing apparatus in which a substrate is accommodatable, the plasma processing apparatus including a chamber providing a space for processing the substrate; a substrate stage to support the substrate within the chamber, the substrate stage including a lower electrode; a shower head assembly over the substrate stage within the chamber to face the lower electrode and to spray out a gas toward the substrate; and a power supply to apply a power to the lower electrode to generate plasma within the chamber, wherein the shower head assembly includes a shower plate including a plurality of injection holes through which a gas is sprayable out toward the substrate; and a compensation plate on a lower surface of the shower plate and facing the substrate, the compensation plate including a first compensating portion having first gas passages of a first length and a second compensating portion having second gas passages of a second length that is greater than the first length, and wherein the first gas passage and the second gas passage are respectively in fluid communication with the injection holes.

The embodiments may be realized by providing a plasma processing method, the method including loading a substrate on a substrate stage within a chamber, the substrate stage including a lower electrode; introducing a gas through injection holes of a shower plate facing the lower electrode; spraying out the gas toward the substrate through a compensation plate on a lower surface of the shower plate, the compensation plate including a first compensating portion and a second compensating portion, wherein the gas is discharged through first gas passages of the first compensating portion and having a first length and is discharged through second gas passages of the second compensating portion and having a second length; and applying a plasma power to the lower electrode to generate plasma within the chamber.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
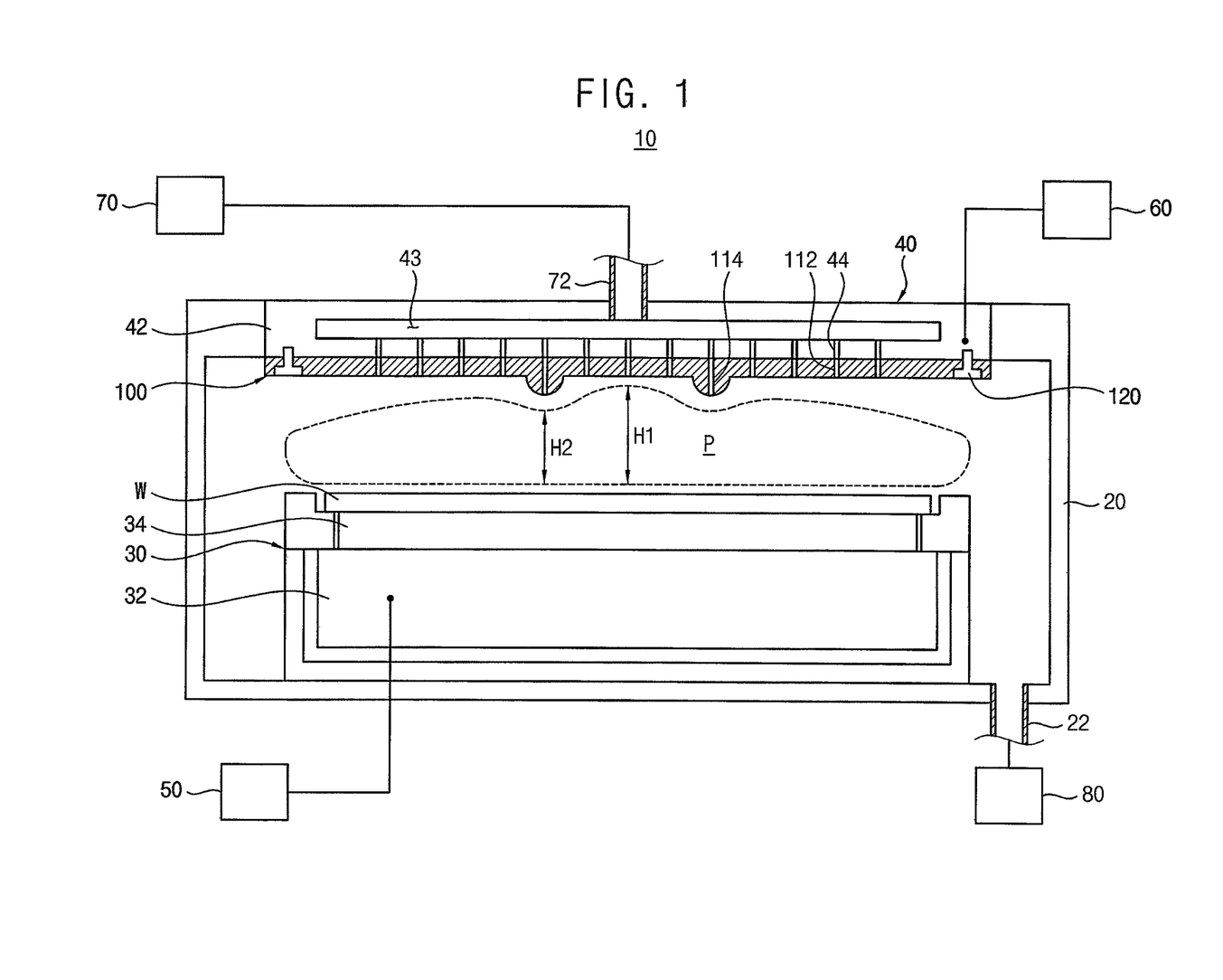
FIG. 1 illustrates a diagram of a plasma processing apparatus in accordance with example embodiments.
Figure 2:
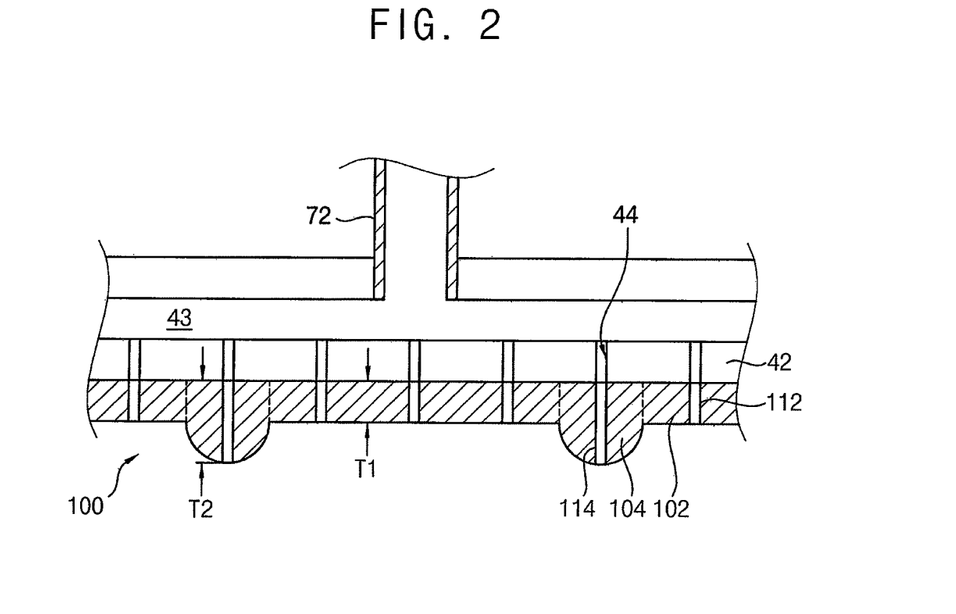
FIG. 2 illustrates a cross-sectional view of a portion of a shower head of the plasma processing apparatus of FIG. 1.
Figure 3:
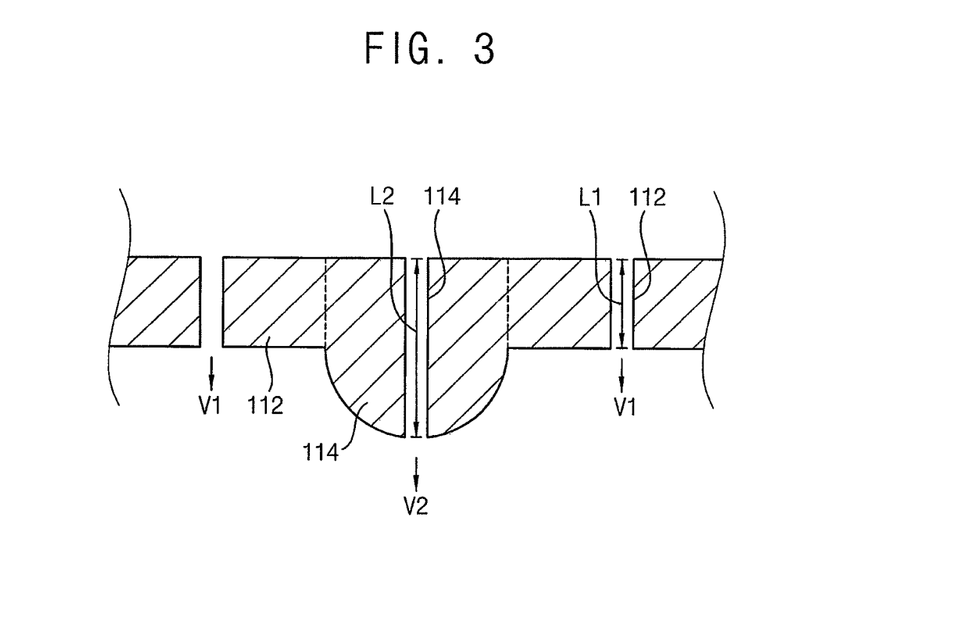
FIG. 3 illustrates a cross-sectional view of a portion of a compensation plate of the shower head assembly of FIG. 2.
Figure 4:
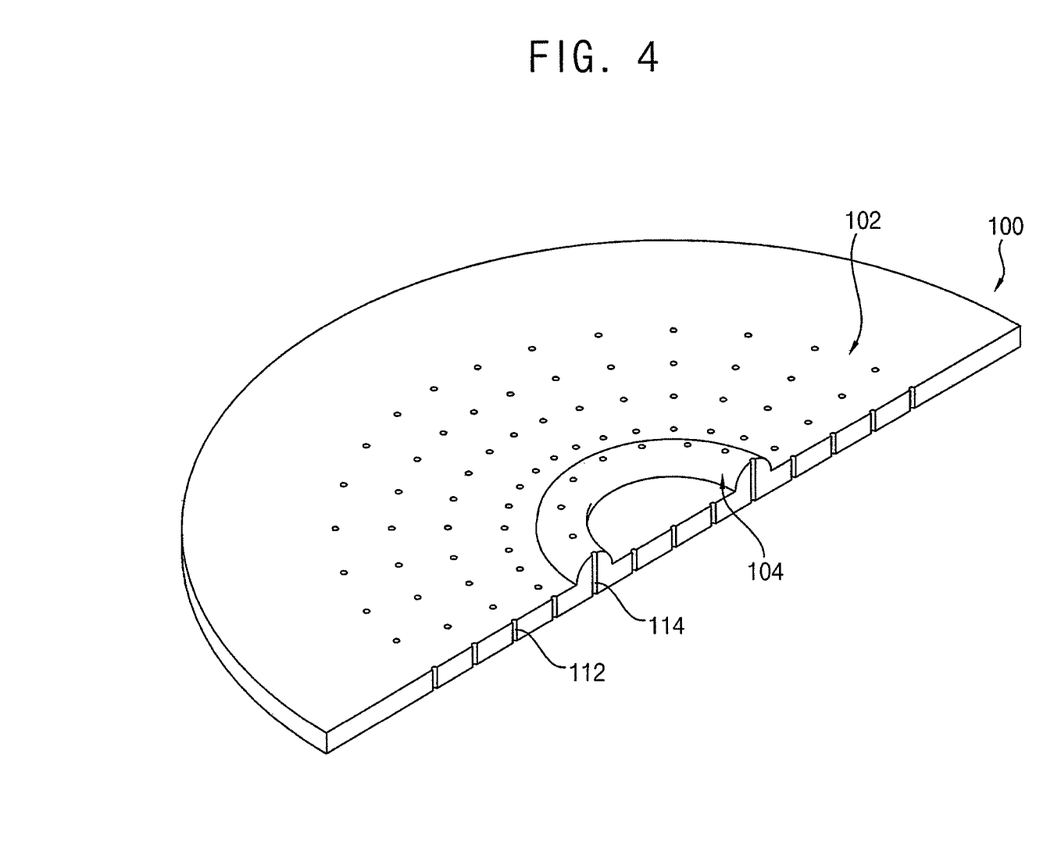
FIG. 4 illustrates an exploded perspective view of the compensation plate of FIG. 2.

FIG. 1 illustrates a diagram of a plasma processing apparatus in accordance with example embodiments. FIG. 2 illustrates a cross-sectional view of a portion of a shower head of the plasma processing apparatus of FIG. 1. FIG. 3 illustrates a cross-sectional view of a portion of a compensation plate of the shower head assembly of FIG. 2. FIG. 4 illustrates an exploded perspective view illustrating the compensation plate of FIG. 2.

Referring to FIGS. 1 to 4, a plasma processing apparatus 10 may include a chamber 20, a substrate stage 30 (having a lower electrode 32), a shower head assembly 40 (having an upper electrode), and a power supply 50, 60. The plasma processing apparatus 10 may further include a gas supply, an exhaust 80, or the like.

In an implementation, the plasma processing apparatus 10 may be an apparatus to etch a layer on a substrate (such as a wafer W) within the capacitively coupled plasma (CCP) chamber. In an implementation, inductively coupled plasma, microwave plasma, or the like, may be generated by the plasma processing apparatus. In an implementation, the plasma process apparatus may be used as a deposition apparatus, a cleaning apparatus, or the like. In an implementation, the substrate may include a semiconductor substrate, a glass substrate, or the like.

The substrate stage 30 may be arranged within the chamber 20 to support the substrate. For example, the substrate stage 30 may serve as a susceptor for supporting the wafer W thereon. The substrate stage 30 may include a support plate 34 having an electrostatic electrode for holding the wafer W using electrostatic force. The wafer W may be adsorptively held on the electrostatic electrode when a direct current is applied thereto by a DC power source through an ON-OFF switch.

The substrate stage 30 may include the circular plate-shaped lower electrode 32 under the support plate 34. The lower electrode 32 may be movable upwardly and downwardly by a driver. The substrate stage 30 may include a focus ring along a circumference of the support plate 34 to surround the wafer W.

In an implementation, a heater, a plurality of fluid lines, or the like may be installed in the substrate stage 30. The heater may be electrically connected to a power source to heat the wafer W through the support plate 34. The heater may include a coil having a spiral shape. The fluid line may be provided as a cooling channel through which a heat transfer gas or fluid circulates. The fluid line may be installed in the support plate 34 to have a spiral shape.

In an implementation, a gate for loading/unloading of the wafer W may be provided in a sidewall of the chamber 20. The wafer W may be loaded/unloaded onto/from the substrate stage through the gate.

The exhaust may be connected to an exhaust port 22 in a bottom portion of the chamber 20, through an exhaust line. The exhaust may include a vacuum pump such as a turbo-molecular pump or the like, to control a pressure of the chamber 20 so that the processing space inside the chamber 20 may be depressurized to a desired vacuum level. Additionally, process by-products and residual process gases may be discharged through the exhaust port 24 from the chamber 20.

The shower head assembly 40 may be over (e.g., may be spaced apart from and face) the substrate stage 30 such that the upper electrode faces the lower electrode 32. The shower head assembly 40 may facilitate spraying of a gas outwardly therefrom toward the substrate. The shower head assembly 40 may include an electrode plate as the upper electrode. The chamber space between the upper electrode and the lower electrode 32 may be a plasma generation region.

In an implementation, the power supply may include a first power supply 50 and a second power supply 60. The first power supply 50 may apply a plasma power, e.g., sinusoidal wave power, to the lower electrode 32 to generate plasma within the chamber 20. The second power supply 60 may apply a ground power to the upper electrode. In an implementation, the second power supply 60 may apply a sinusoidal wave or non-sinusoidal wave power to the upper electrode.

The power signal applied to the lower electrode 32 may have a sinusoidal voltage waveform. For example, the sinusoidal wave power may be a RF (radio frequency) power having a frequency range of about 27 MHz to about 2.45 GHz and a RF power range of about 100 W to about 1000 W.

The gas supplied to the chamber 20 may be excited by an electric field of the sinusoidal wave power to generate plasma (P). An etching process may be performed using the plasma.

Hereinafter, the shower head assembly will be explained in detail.

In an implementation, as illustrated in FIGS. 1 to 4, the shower head assembly 40 may include, e.g., a shower plate 42 and a compensation plate 100.

In an implementation, the shower plate 42 may be supported in or on an upper portion of the chamber 20 by an insulation shield. The shower plate 42 may be an electrode support plate including a circular plate-shaped electrode plate. The upper electrode may be a part of a shower head for supplying the gas into the chamber 20.

The shower plate 42 may have a lower surface facing the wafer W on the substrate stage 30. The shower plate 42 may include a plurality of injection holes 44 which are formed to penetrate therethrough to supply the gas toward the wafer W on the substrate stage 30.

The shower plate 42 may include a gas diffusion room or gas diffusion space 43 therein. The gas diffusion space 43 may extend in a radial direction, and the injection holes 44 may be connected to or in fluid communication with the gas diffusion space 43. In an implementation, the shower plate 42 may include a conductive material, e.g., aluminum, and may have a water cooling channel therein.

The gas supply may include a gas supply lines 72 and a gas supply source 70, such as gas supply elements. The gas supply line 72 may be connected to the gas diffusion space 43 of the shower plate 42, and a flow controller may control an amount of the gas supplied into the chamber 20 through the gas supply line 70. For example, the gas supply source 70 may include a plurality of gas tanks, and the flow controller may include a plurality of mass flow controllers (MFCs) corresponding to the gas tanks. The mass flow controllers may independently control the amounts of the supplied gases respectively.

In an implementation, the compensation plate 100 may be on a lower surface of the shower plate 42, e.g., a surface of the shower plate 42 that faces the wafer W. The compensation plate 100 may be detachably installed on or detachably coupled with the shower plate 42. The compensation plate 100 may be fastened to the shower plate 42 by fastening bolts 120 that penetrates through a peripheral region of the compensation plate 100.

In an implementation, the compensation plate 100 may include a dielectric material. In an implementation, the compensation plate 100 may include, e.g., a ceramic material. In an implementation, the compensation plate 100 may include, e.g., silica ($SiO_2$), alumina ($Al_2O_3$), yttrium fluoride ($YF_3$), yttrium oxide ($Y_2O_3$), silicon carbide (SiC), or the like. As used herein, the term "or" is not an exclusive term, e.g., "A or B" includes A, B, or A and B.

The compensation plate 100 may include a first compensating portion 102 and a second compensating portion 104. The first compensating portion 102 and the second compensating portion 104 may be formed integrally to provide the circular shaped plate. The first compensating portion 102 may cover a first portion of the lower surface of the shower plate 42 to face a first region of the wafer W, and the second compensating portion 104 may cover a second portion of the lower surface of the shower plate 42 to face a second region of the wafer W.

The first compensating portion 102 may have a first thickness T1 and the second compensating portion 104 may have a second thickness T2 (e.g., measured in the same direction as the first thickness T) that is greater than the first thickness T1. The first compensating portion 102 may have an even or flat surface (lower surface), and the second compensating portion 104 may have a convex shape protruding (e.g., outwardly) from the surface of the first compensating portion 102. In an implementation, the protruding shape of the second compensating portion 104 may have a semicircular cross-sectional shape. In an implementation, the protruding shape of the second compensating portion 104 may have a polygonal cross-sectional shape.

In an implementation, the first region of the wafer W may include a central region and a peripheral region, and the second region of the wafer W may include a middle region between the central region and the peripheral region. As viewed in plan view, the second compensating portion 104 may have an annular shape extending in a circumferential direction at a predetermined distance from a center of the compensation plate 100.

The first compensating portion 102 may have first gas passages 112 aligned with and connected to (e.g., in fluid communication with) the injection holes 44 respectively. The second compensating portion 104 may have second gas passages 114 aligned with and connected to the injection holes 44 respectively. The first gas passage 112 may have a first length L1 and the second gas passage 114 may have a second length L2 (e.g., measured in the same direction as the first length L1) that is greater than the first length L1. A diameter of the first gas passage 112 may be the same as or different from a diameter of the second gas passage 114. During operation of the apparatus, the gas may be discharged at a first velocity V1 through the first gas passage 112 and may be discharged at a second velocity V2 (that is less than the first velocity V1) through the second gas passage 114.

A density distribution of plasma (P) may be adjusted by an arrangement of the first compensating portion 102 and the second compensating portion 104. In an implementation, as illustrated in FIG. 1, plasma P in the central region of the wafer W may have a first gap H1, and plasma P in the middle region of the wafer W may have a second gap H2 (e.g., measured in the same direction as the first gap H1) that is less than the first gap H1.

In an implementation, shapes and thicknesses of the first compensating portion 102 and the second compensating portion 104, lengths of the first gas passage 112 and the second gas passage 114, or the like, may be adjusted to help control gas conductance, gas diffusion, local impedance, a gap in a plasma generation region, or the like. For example, a plasma density profile across the whole region of the wafer W may be adjusted to thereby obtain a uniform etch rate.

Figure 5:
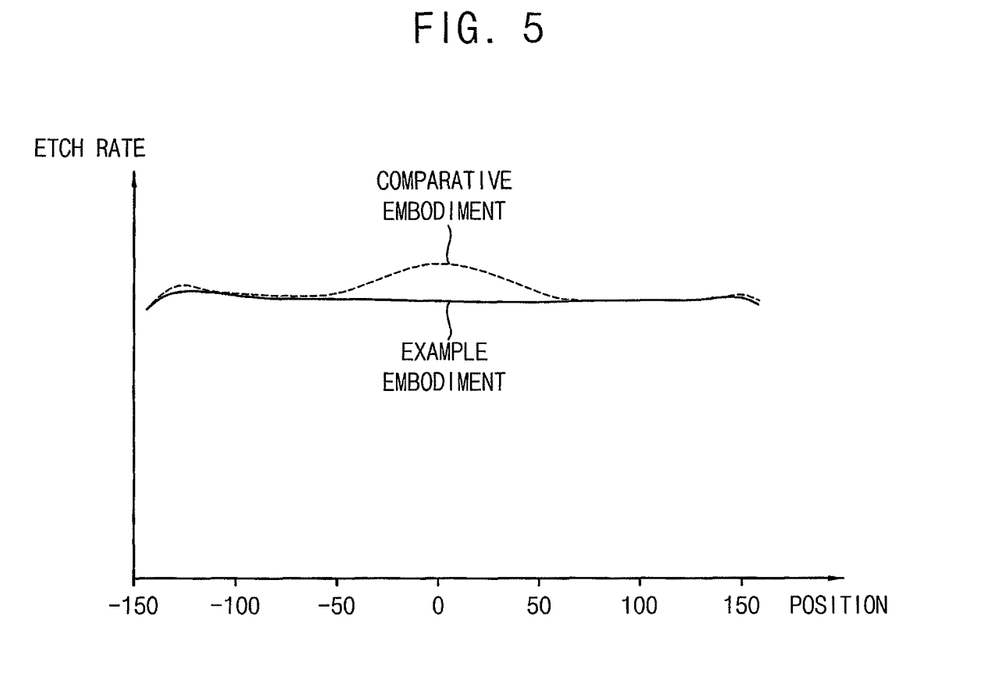
FIG. 5 illustrates a graph of etch rates of etch processes performed using a shower head according to a comparative embodiment and the shower head assembly of FIG. 1.

FIG. 5 illustrates a graph of etch rates of etch processes performed using a shower head according to a comparative embodiment and the shower head assembly of FIG. 1. The shower head according to the comparative embodiment did not have a compensation plate.

Referring to FIG. 5, an etch rate distribution of an etch process performed using a shower head of a comparative embodiment shows relatively high etch rates in a central region and a middle region of the wafer W. On the other hand, an etch rate distribution of an etch process performed using the shower head assembly of FIG. 1 shows a uniform etch rate distribution across the whole region of the wafer W.

For example, a position, a height, or the like, of the second compensating portion 104 having the convex shape may be adjusted to thereby obtain a desired uniform etch rate.

Hereinafter, a method of processing a substrate using the plasma processing apparatus of FIG. 1 will be explained.

Figure 6:
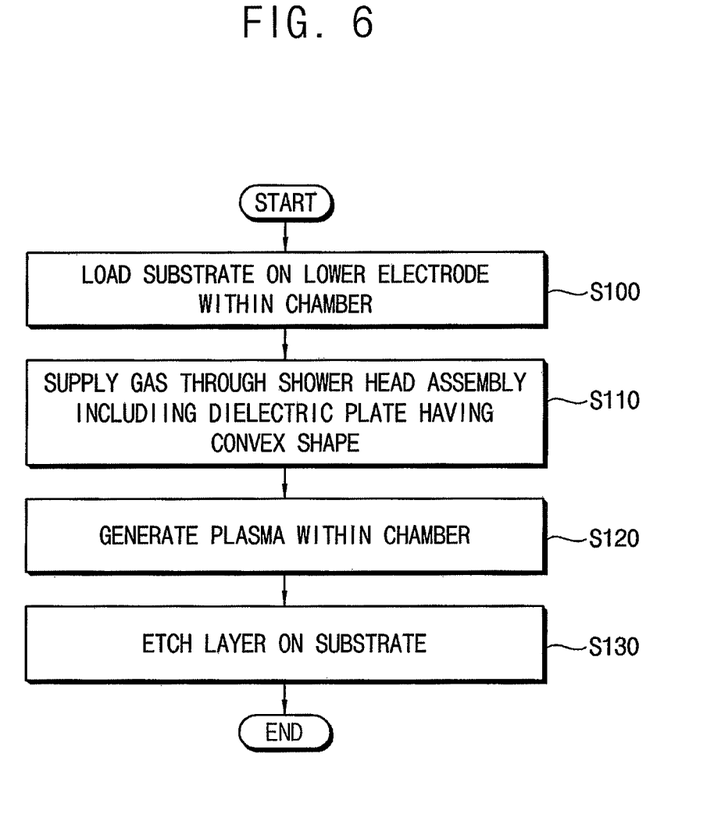
FIG. 6 illustrates a flow chart of a plasma processing method in accordance with example embodiments.

FIG. 6 illustrates a flow chart of a plasma processing method in accordance with example embodiments.

Referring to FIG. 6, after a substrate is loaded into a chamber 20 (S100), a process gas may be supplied into the chamber through a shower head assembly (S110).

First, a semiconductor wafer W may be loaded on the support plate 34 of the substrate stage 30 within the chamber 20. The process gas (e.g., an etching gas) may be introduced into the chamber 20 from the gas supply line 72, and then a pressure of the chamber 20 may be controlled to a desired vacuum level by a gas exhaust connected to the exhaust port 22.

For example, the gas may be supplied into the gas diffusion space 43 of the shower plate 42 connected to the gas supply line 72, and the supplied gas may be introduced through injection holes 44. The gas may be sprayed out onto the semiconductor wafer W through the first gas passage 112 and the second gas passage 114 of the compensation plate 100 connected to the injection holes 44 respectively.

For example, the gas may be discharged at a first velocity V1 through the first gas passage 112 and may be discharged at a second velocity V2 (that is less than the first velocity V1) through the second gas passage 114.

Then, a sinusoidal wave power may be applied to a lower electrode of the substrate stage 30 to generate plasma within the chamber 20 (S120), and then, an etch process may be performed on a layer on the wafer W (S130).

The first power supply 40 may apply the sinusoidal wave power to the lower electrode 32 to generate plasma within the chamber 20. For example, as the radio frequency power having a predetermined frequency (e.g., 13.56 MHz) is applied to the lower electrode 32, an electromagnetic field induced by the lower electrode 32 may be applied to a source gas within the chamber 20 to generate plasma. Here, a second power supply 60 may apply a ground power to an upper electrode of the shower head assembly. In an implementation, the second power supply 60 may apply a sinusoidal wave or non-sinusoidal wave power to the upper electrode.

As mentioned above, the shower head assembly may include the compensation plate 100 on a lower surface of the shower plate 42 and including a dielectric material. The compensation plate 100 may include the first compensating portion 102 having a flat or plate shape in a position corresponding to the first region of the wafer W and the second compensating portion 104 having the convex shape in a position corresponding to the second region of the wafer W. The first compensating portion 102 may include the first gas passages 112 in fluid communication with the injection holes 44 of the shower plate 42 respectively and may have the first length L1. The second compensating portion 104 may include the second gas passages 114 in fluid communication with the injection holes 44 of the shower plate 42 respectively and may have the second length L2 that is greater than the first length L1.

In an implementation, shapes and thicknesses of the first compensating portion 102 and the second compensating portion 104, lengths of the first gas passage 112 and the second gas passage 114, or the like, may be adjusted to help control gas conductance, gas diffusion, local impedance, a gap in a plasma generation region, or the like. For example, a plasma density profile across the whole region of the wafer W may be adjusted to thereby obtain a uniform etch rate.

Figure 7:
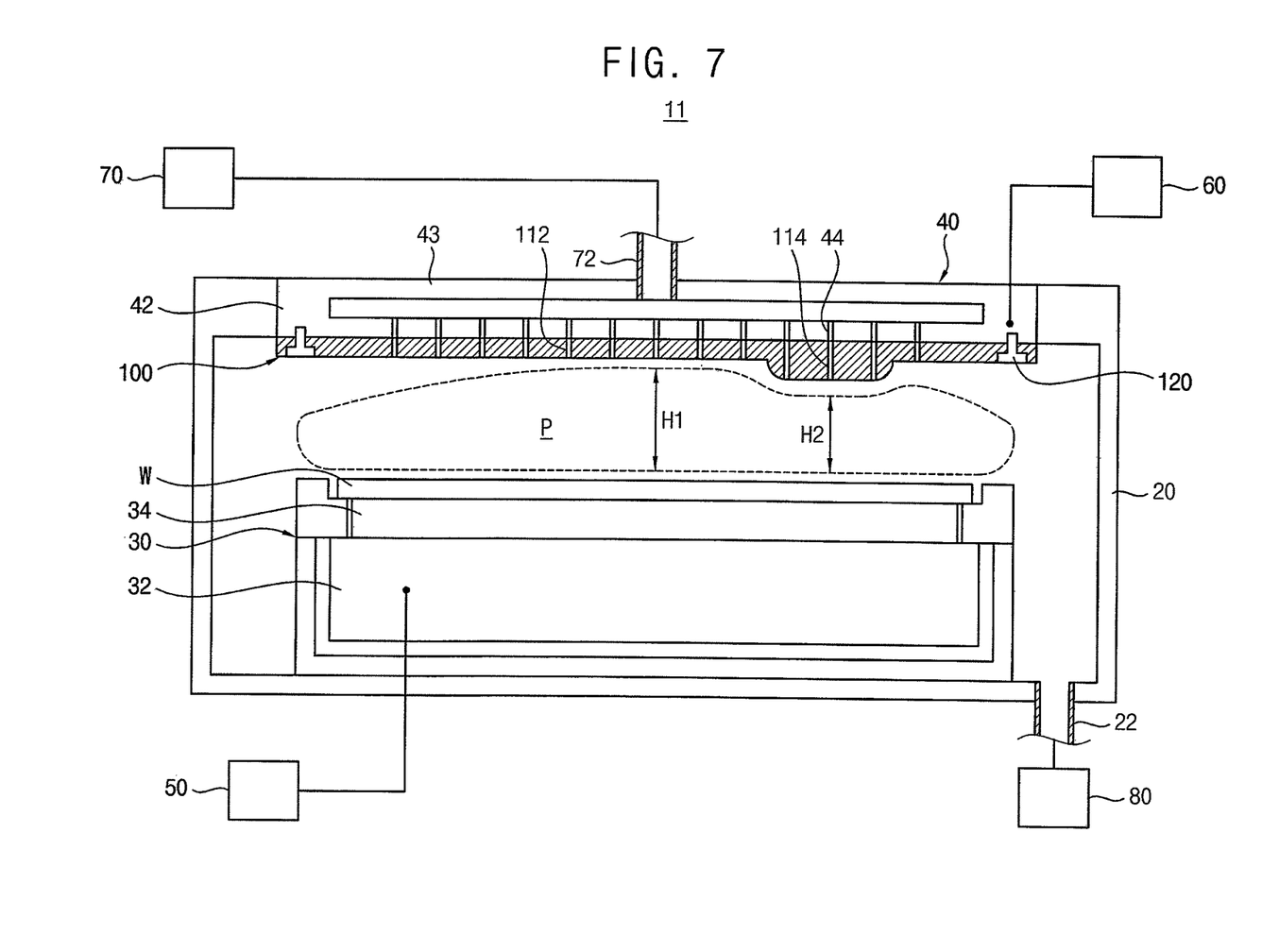
FIG. 7 illustrates a diagram of a plasma processing apparatus in accordance with example embodiments.
Figure 8:
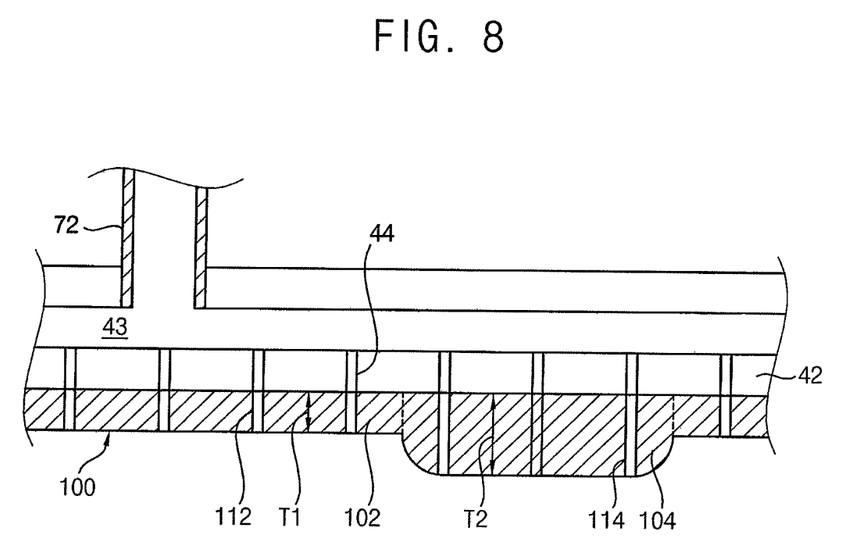
FIG. 8 illustrates a cross-sectional view of a portion of a shower head assembly of the plasma processing apparatus of FIG. 7.
Figure 9:
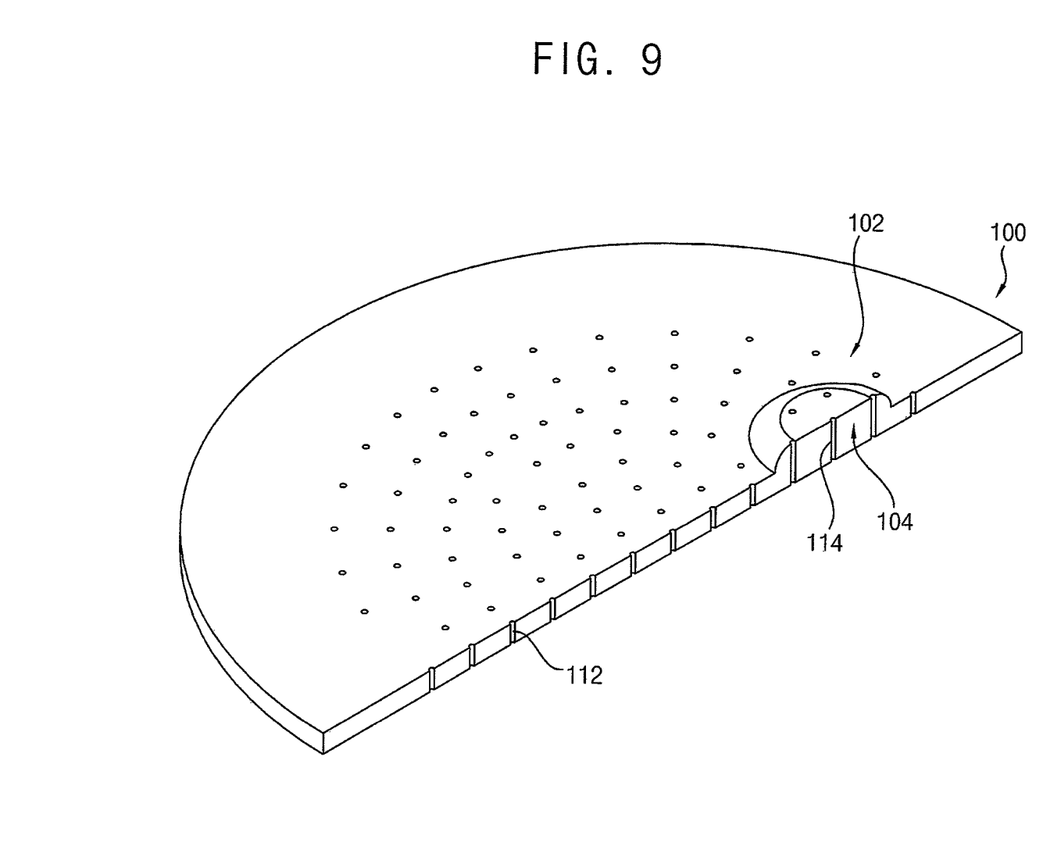
FIG. 9 illustrates an exploded perspective view of a compensation plate of the shower head assembly of FIG. 8.

FIG. 7 illustrates a diagram of a plasma processing apparatus in accordance with example embodiments. FIG. 8 illustrates a cross-sectional view of a portion of a shower head assembly of the plasma processing apparatus of FIG. 7. FIG. 9 illustrates an exploded perspective view of a compensation plate of the shower head assembly of FIG. 8. The plasma processing apparatus may be substantially the same as or similar to the plasma processing apparatus as described with reference to FIGS. 1 to 4, except for positions and shapes of first compensating portion and the second compensating portion. Thus, same reference numerals will be used to refer to the same or like elements and repeated explanation concerning the above elements may be omitted.

Referring to FIGS. 7 to 9, a compensation plate 100 of a plasma processing apparatus 11 may include a first compensating portion 102 covering a first portion of a lower surface of a shower plate 42 to face a first region of a wafer W and a second compensating portion 104 covering a second portion of the lower surface of the shower plate 42 to face a second region of the wafer W.

The first compensating portion 102 may have a first thickness T1 and the second compensating portion 104 may have a second thickness T2. The first compensating portion 102 may have a flat surface (lower surface), and the second compensating portion 104 may have a convex shape protruding from the surface of the first compensation portion 102. In an implementation, the protruding shape of the second compensating portion 104 may have a semicircular or otherwise rounded cross-section shape.

The second region of the wafer W may include a local region adjacent to a peripheral region of the wafer W, and the first region of the wafer W may include a remaining region except the local region. As viewed in plan view, the second compensating portion 104 may be spaced apart from a center of the compensation plate 100 by a predetermined distance to have an isolated circular shape adjacent to the peripheral region of the wafer W.

A density distribution of plasma (P) may be adjusted by an arrangement of the first compensating portion 102 and the second compensating portion 104. In an implementation, as illustrated in FIG. 7, plasma P in the central region of the wafer W may have a first gap H1, and plasma P in a middle region of the wafer W may have a second gap H2 that is less than the first gap H1.

In an implementation, positions and shapes of the first compensating portion 102 and the second compensating portion 104 may be adjusted to help control a plasma density and a sheath thickness over the central region and the peripheral region of the wafer W. For example, a plasma density profile across the whole region of the wafer W may be adjusted to thereby obtain a uniform etch rate.

Figure 10:
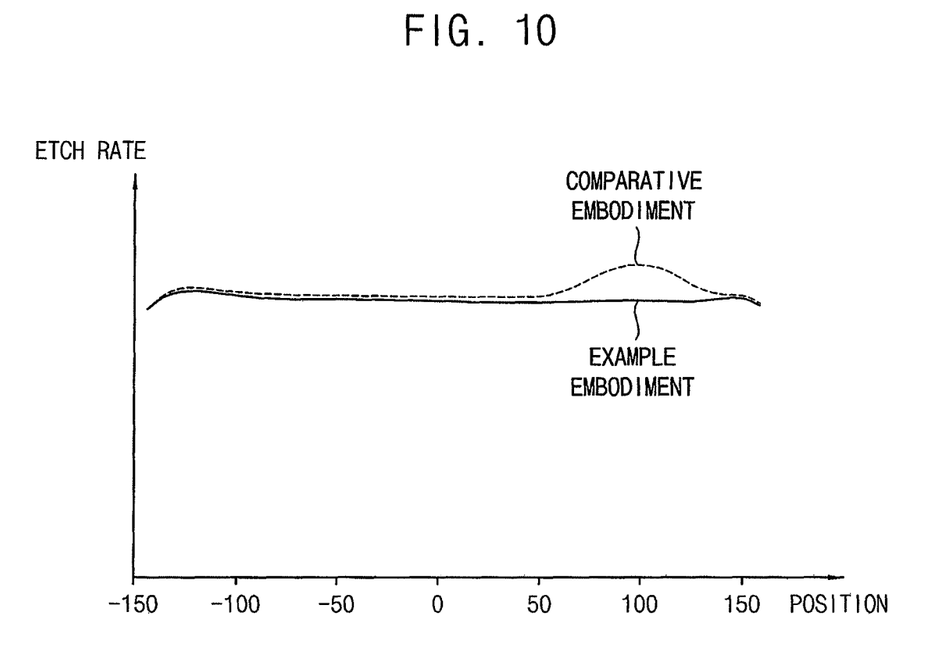
FIG. 10 illustrates a graph of etch rates of etch processes performed using a shower head according to a comparative embodiment and the shower head assembly of FIG. 7.

FIG. 10 illustrates a graph of etch rates of etch processes performed using a shower head according to a comparative embodiment and the shower head assembly of FIG. 7. The shower head according to the comparative embodiment did not have a compensation plate.

Referring to FIG. 10, an etch rate distribution of an etch process performed using a shower head of a comparative embodiment shows a relatively high etch rate in a local region adjacent to a peripheral region of the wafer W. On the other hand, an etch rate distribution of an etch process performed using the shower head assembly of FIG. 7 represents a uniform etch rate distribution across the whole region of the wafer W.

For example, a position, a height, or the like, of the second compensating portion 104 having the convex shape may be adjusted to thereby obtain a desired uniform etch rate.

A semiconductor device manufactured by a plasma processing apparatus and a plasma processing method in accordance with example embodiments may be used in various systems such as a computing system. The semiconductor device may include finFET, DRAM, VAND, or the like. The system may be applied to a computer, a portable computer, a laptop computer, a personal portable terminal, a tablet, a cell phone, a digital music player, or the like.

By way of summation and review, if plasma density distribution across a wafer were to be non-uniform, failures could occur in the etching process due to etch non-uniformity.

One or more embodiments may provide a shower head assembly configured to supply a gas into a chamber to generate plasma.

One or more embodiments may provide a shower head assembly for a plasma processing apparatus capable of improving uniformity of plasma density.

Shapes and thicknesses of the first and second compensating portions, lengths of the first and second gas passages, or the like, may be adjusted to control gas conductance, gas diffusion, local impedance, a gap in a plasma generation region, etc. For example, a plasma density profile across the whole region of the wafer W may be adjusted to thereby obtain a uniform etch rate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A shower head assembly for a plasma processing apparatus in which a substrate is accommodatable on a substrate stage within a chamber, the shower head assembly comprising:

a shower plate including a plurality of injection holes through which a gas is sprayable out toward the substrate; and a compensation plate on a lower surface of the shower plate and facing the substrate, the compensation plate including a first compensating portion having first gas passages of a first length and a second compensating portion having second gas passages of a second length that is greater than the first length, wherein:

the first gas passages and the second gas passages are respectively in fluid communication with the injection holes, the first compensating portion has a flat surface, the second compensating portion has a convex shape protruding relative to the flat surface of the first compensating portion, and the protruding second compensating portion has a semicircular vertical cross-sectional shape.

2. The shower head assembly as claimed in claim 1, wherein the first compensating portion has a first thickness and the second compensating portion has a second thickness that is greater than the first thickness.

3. The shower head assembly as claimed in claim 1, wherein the gas is dischargeable at a first velocity through the first gas passages and is dischargeable at a second velocity through the second gas passages, the second velocity being less than the first velocity.

4. The shower head assembly as claimed in claim 1, wherein the compensation plate includes a dielectric material.

5. The shower head assembly as claimed in claim 4, wherein the compensation plate includes silica ($SiO_2$), alumina ($Al_2O_3$), yttrium fluoride ($YF_3$), yttrium oxide ($Y_2O_3$), or silicon carbide (SiC).

6. The shower head assembly as claimed in claim 1, wherein the second compensating portion has an annular shape extending in a circumferential direction at a predetermined distance from a center of the compensation plate.

7. The shower head assembly as claimed in claim 1, wherein the compensation plate is detachably installed on the shower plate.

8. The shower head assembly as claimed in claim 1, wherein:
the shower plate includes a gas diffusion space therein, and
the injection holes are in fluid communication with the gas diffusion space.

9. A plasma processing apparatus in which a substrate is accommodatable, the plasma processing apparatus comprising:
a chamber providing a space for processing the substrate;
a substrate stage to support the substrate within the chamber, the substrate stage including a lower electrode;
a shower head assembly over the substrate stage within the chamber to face the lower electrode and to spray out a gas toward the substrate; and
a power supply to apply a power to the lower electrode to generate plasma within the chamber,
wherein the shower head assembly includes:
a shower plate including a plurality of injection holes through which a gas is sprayable out toward the substrate; and
a compensation plate on a lower surface of the shower plate and facing the substrate, the compensation plate including a first compensating portion having first gas passages of a first length and a second compensating portion having second gas passages of a second length that is greater than the first length,
wherein the first gas passages and the second gas passages are respectively in fluid communication with the injection holes,
wherein the first compensating portion has a flat surface,
wherein the second compensating portion has a convex shape protruding relative to the flat surface of the first compensating portion, and
wherein the protruding second compensating portion has a semicircular vertical cross-sectional shape.

10. The plasma processing apparatus as claimed in claim 9, wherein the shower plate includes an upper electrode.

11. The plasma processing apparatus as claimed in claim 9, wherein the compensation plate includes a dielectric material.

12. The plasma processing apparatus as claimed in claim 11, wherein the compensation plate includes silica ($SiO_2$), alumina ($Al_2O_3$), yttrium fluoride ($YF_3$), yttrium oxide ($Y_2O_3$), or silicon carbide (SiC).

13. The plasma processing apparatus as claimed in claim 9, wherein:
the first compensating portion has a first thickness, and
the second compensating portion has a second thickness that is greater than the first thickness.

14. The plasma processing apparatus as claimed in claim 9, wherein the gas is dischargeable at a first velocity through the first gas passages and is dischargeable at a second velocity through the second gas passages, the second velocity being less than the first velocity.

15. The plasma processing apparatus as claimed in claim 9, wherein the compensation plate is detachably installed on the shower plate.

16. A plasma processing method, the method comprising:
loading a substrate on a substrate stage within a chamber, the substrate stage including a lower electrode;
introducing a gas through injection holes of a shower plate facing the lower electrode;
spraying out the gas toward the substrate through a compensation plate on a lower surface of the shower plate, the compensation plate including a first compensating portion and a second compensating portion, wherein the gas is discharged through first gas passages of the first compensating portion and having a first length and is discharged through second gas passages of the second compensating portion and having a second length; and
applying a plasma power to the lower electrode to generate plasma within the chamber,
wherein:
the first compensating portion has a flat surface,
the second compensating portion has a convex shape protruding relative to the flat surface of the first compensating portion, and
the protruding second compensating portion has a semicircular vertical cross-sectional shape.

17. The shower head assembly as claimed in claim 1, wherein the second compensating portion has an isolated circular shape adjacent to a peripheral region of the compensation plate such that the compensation plate has an asymmetrical shape.

18. The plasma processing apparatus as claimed in claim 9, wherein the second compensating portion has an isolated circular shape adjacent to a peripheral region of the compensation plate such that the compensation plate has an asymmetrical shape.

19. The plasma processing method as claimed in claim 16, wherein the second compensating portion has an isolated circular shape adjacent to a peripheral region of the compensation plate such that the compensation plate has an asymmetrical shape.

* * * * *